United States Patent
Robinson et al.

(10) Patent No.: US 6,853,244 B2
(45) Date of Patent: Feb. 8, 2005

(54) MULTI-MODE MULTI-AMPLIFIER ARCHITECTURE

(75) Inventors: Ian Robinson, Venice, CA (US); Frank Winter, San Diego, CA (US)

(73) Assignee: Northrop Grumman Corproation, Los Angeles, CA (US)

( * ) Notice: Subject to any disclaimer, the term of this patent is extended or adjusted under 35 U.S.C. 154(b) by 44 days.

(21) Appl. No.: 10/603,682

(22) Filed: Jun. 24, 2003

(65) Prior Publication Data

US 2004/0263246 A1 Dec. 30, 2004

(51) Int. Cl.[7] .................................................. H03F 1/14
(52) U.S. Cl. ...................... 330/51; 330/124 R; 330/136; 330/151
(58) Field of Search .............................. 330/51, 724 R, 330/151, 136

(56) References Cited

U.S. PATENT DOCUMENTS

| | | | |
|---|---|---|---|
| 2,210,028 A | | 8/1940 | Doherty |
| 3,449,685 A | * | 6/1969 | Holmes ...................... 330/278 |
| 5,420,541 A | | 5/1995 | Upton et al. |
| 6,043,707 A | | 3/2000 | Budnik |
| 6,097,252 A | | 8/2000 | Sigmon et al. |
| 6,285,251 B1 | | 9/2001 | Dent et al. |
| 6,538,509 B2 | * | 3/2003 | Ren ........................... 330/149 |
| 6,657,487 B2 | * | 12/2003 | Lauffenburger et al. ....... 330/9 |

FOREIGN PATENT DOCUMENTS

JP          358068312 A   *   4/1983

OTHER PUBLICATIONS

New U.S. Winter, et al. patent application entitled "Polar and Linear Amplifier System", Filed Jun. 24, 2003.
New U.S. Robinson, et al. patent application entitled "Multi–Mode Amplifier System", Filed Jun. 24, 2003.
European Search Report for EP 03 025 797.6, completed Aug. 10, 2004.

* cited by examiner

Primary Examiner—Michael B. Shingleton
(74) Attorney, Agent, or Firm—Tarolli, Sundheim, Covell & Tummino L.L.P.

(57) ABSTRACT

An amplification architecture or system is provided having a multiple amplifier system that switches modes of operation between operation in a component mode and a composite mode based on a characteristic of an input signal relative to a threshold level. In the component mode, the components of the input signal are employed to different terminals of the multiple amplifier system that provide a reconstructed amplified representation of the input signal. In the composite mode, the input signal is amplified to provide an amplified representation of the input signal.

27 Claims, 8 Drawing Sheets

MULTI-MODE MULTI-AMPLIFIER ARCHITECTURE

TECHNICAL FIELD

The present invention relates generally to electronic devices, and more particularly to an amplifier system that operates in multiple modes.

BACKGROUND OF THE INVENTION

RF power amplifiers used for wireless communication transmitters, with spectrally efficient modulation-formats, require high linearity to preserve modulation accuracy and to limit spectral regrowth. Typically, a linear amplifier, Class-A type, Class-AB type or Class-B is employed to faithfully reproduce inputs signals and to limit the amplifier output within a strict emissions mask. Linear amplifiers are capable of electrical (DC power in to RF power out or DC-RF) efficiencies greater than 50% when operated at saturation. However, they are generally not operated at high efficiency due to the need to provide high linearity. For constant envelope waveforms, linear amplifiers are often operated below saturation to provide for operation in their linear regime. Time varying envelopes present an additional challenge. The general solution is to amplify the peaks of the waveform near saturation, resulting in the average power of the waveform being amplified at a level well backed-off from saturation. The back-off level, also referred to as output power back-off (OPBO), determines the electrical efficiency of a linear amplifier.

For example, the efficiency of a Class-A type amplifier decreases with output power relative to its peak value (EFF=$P_{OUT}/P_{PEAK}$). The efficiency of Class-B type amplifiers also decreases with output power relative to its peak value (EFF=$(P_{OUT}/P_{PEAK})^{1/2}$). Class-AB type amplifiers have output power variations intermediate between these values. Thus, there is customarily an inherent tradeoff between linearity and efficiency in amplifier designs.

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent channels but produces time-varying envelopes. In addition to amplifying individual waveforms with time varying envelopes, many transmitters (especially in base stations) are being configured to amplify multiple carriers. Multi-carrier signals have high a wide distribution of power levels resulting in a large peak-to-average ratio (PAR). Therefore, the operation of the linear amplifiers in these types of signals is very inefficient, since the amplifiers must have their supply voltage sized to handle the large peak voltages even though the signals are much smaller a substantial portion of the time. Additionally, the size and cost of the power amplifier is generally proportional to the required peak output power of the amplifier.

Wideband Code Division Multiple Access (WCDMA), Orthogonal Frequency Division Multiplexing (OFDM), and multi-carrier versions of Global Standard for Mobile Communication (GSM) and Code Division Multiple Access 2000 (CDMA 2000) are wireless standards and application growing in use. Each requires amplification of a waveform with high PAR levels, above 10 dB in some cases. The sparse amount of spectrum allocated to terrestrial wireless communication requires that transmissions minimize out-of-band (OOB) emissions to minimize the interference environment. A linear amplifier used to amplify a waveform with a PAR of 10 dB or more provides only 5–10% DC-RF efficiency. The peak output power for the amplifier is sized by the peak waveform. The cost of the amplifier scales with its, peak power. Several other circuit costs including heat sinks and DC-DC power supplies scale inversely to peak power and dissipated heat (which results from the electrical inefficiency). Related base station costs of AC-DC power supplies, back-up batteries, cooling, and circuit breakers also scale inversely with efficiency as does the electrical operating costs. Clearly, improving DC-RF efficiency is a major cost saver both for manufacture and operation. Non-linear classes (e.g., Class C, D, E and F type amplifiers) of RF power amplifiers switch the RF devices on and off in or near saturation, and are more efficient than linear classes of operation such as Class-A, Class-AB or Class-B type which conduct during at least half of the RF cycle and are significantly backed off from compression. However, non-linear amplifiers can only be employed with constant envelope signals, such as frequency modulations (FM) and certain forms of phase modulation (PM), signals with modulated amplitudes cause severely distorted outputs from these classes of amplifiers. One efficiency enhancement technique that has been employed is known as th Kahn or Envelope Elimination and Restoration (EER) technique. The EER technique detects the envelope of the incoming signal to produce a baseband amplitude modulated (AM) signal. The EER technique limits the input signal to produce a phase modulated (PM) component with a constant envelope. The PM signal is provided to the input of the power amplifier along a PM path and the amplitude modulated component is employed to modulate the supply of the power amplifier along an AM path. Amplitude modulation of the final RF power amplifier restores the envelope to the phase-modulated carrier, creating an amplified version of the input signal. Since the signal input into the power amplifier has a constant envelope amplitude, a more efficient class of power amplifier (e.g., Class-C type amplifiers) can be employed to amplify the input signal. Additionally, since the supply signal is amplitude modulated, the amplifier is operating at compression enhancing the efficiency of the amplifier.

Amplifiers that employ the EER technique are referred to as polar amplifiers. Polar amplifiers have demonstrated very high efficiency but can distort signals and cause significant amounts of OOB emissions. Traditional implementations require the two signal paths (AM and PM) to be extremely well synchronized. The two paths may each require substantially wider bandwidth components than the original signal. If the signal crosses through a zero-amplitude point it may cause the polar amplifier to cut-off and/or require an extremely rapid and difficult phase change in the constant envelope, PM, path. If the signal varies over a large dynamic range it may cause the polar amplifier to operate with very low supply (e.g. drain) voltages resulting in additional signal distortion and can cause the amplifier to shutoff when the supply voltage becomes too low. As a result, the polar amplifier has only been employed with a limited range of waveforms. In traditional EER systems OOB emissions have been controlled by calibrating the delay along the two paths to synchronize the reconstitution of the signal and by detecting the envelope of the output and supplying feedback to the path amplifying the envelope (the AM path).

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to an amplification architecture or system that switches between operation in a component mode and a composite mode. In the component mode, the components of an input signal are provided to one or more amplifiers to provide a reconstructed amplified representation of the input signal. In the composite mode, the input signal is amplified to provide an amplified representation of the input signal.

In one aspect of the invention, a mode selector controls the operation of the amplification system based on a characteristic of an input signal relative to a threshold level (e.g., envelope amplitude threshold level, digital count representation of signal level, power amplifier power level or the like). The mode selector provides components of the input signal to one or more amplifiers in the component mode. The one or more amplifiers then provide a reconstructed amplified representation of the input signal based on the components. The mode selector provides the input signal to an amplifier (e.g., linear amplifier) in the composite mode for amplification of the input signal (e.g., composite signal). A digital-to-analog conversion system can be employed to convert digital representations of components and digital representations of the input signal received from the mode selector to analog representations of the components and analog representation of the input signal prior to amplification.

In another aspect of the invention, the amplification system includes a first amplifier, a second amplifier and a third amplifier. The components of the input signal are provided to the first and second amplifiers, which cooperate to provide a reconstructed amplified representation of the input signal in the component mode. The input signal is provided to the third amplifier in the composite mode to provide an amplified representation of the input signal in the composite mode. The components of the input signal can comprise an amplitude modulated component and a phase modulated component. Alternatively, the components of the input signal can comprise a first phase modulated component and a second phase modulated component.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

The present invention relates to an amplification system or architecture that switches between operation in a component mode and a composite mode based on a characteristic of an input signal relative to a transition point or threshold level (e.g., envelope amplitude level, digital count representation of signal level, power amplifier power level). In the component mode, an input signal is separated into two or more components and transmitted to one or more amplifiers. In the composite mode, a composite signal is amplified via an amplifier (e.g., a linear amplifier). A mode selector controls whether components ("component mode") of the signal are provided to the one or more amplifiers or whether the composite signal ("composite mode") is provided to the amplifier.

Figure 1:
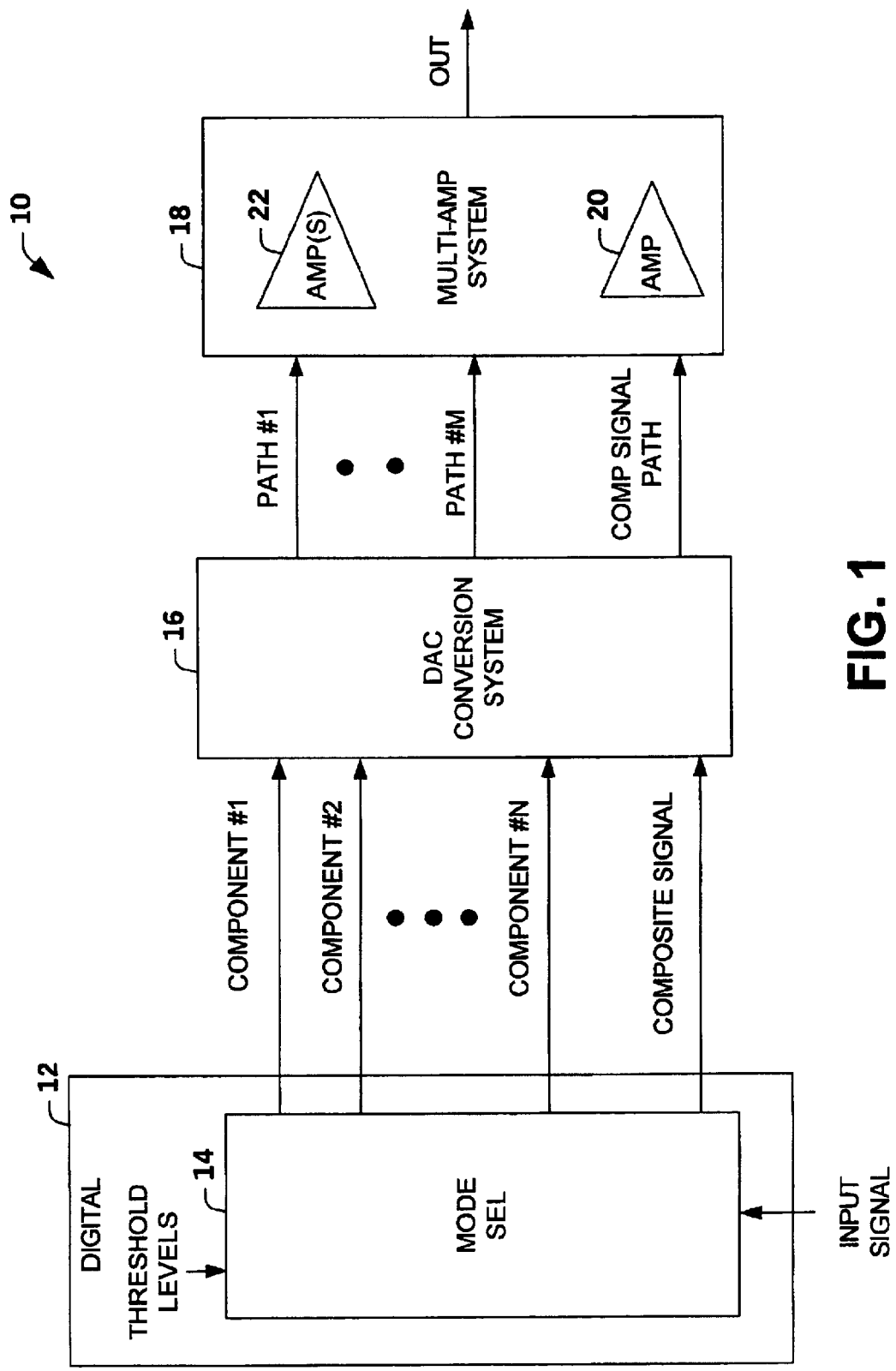
FIG. 1 illustrates a schematic block diagram of a multi-mode multiple amplification system in accordance with an aspect of the present invention.

FIG. 1 illustrates an amplification system or architecture 10 in accordance with an aspect of the present invention. The amplification system 10 switches operation between a component mode and a composite mode based on a characteristic of an input signal relative to a threshold level (e.g., envelope amplitude level, digital count representation of signal level, power amplifier power level). For example, the threshold level can be a selected envelope amplitude level or digital count corresponding to the signal envelope level. The amplification system 10 can then operate in a component mode for envelope amplitude levels between an envelope peak voltage and the threshold level, and in a composite mode for envelope amplitude levels at or below the threshold level.

In the component mode, the input signal is separated into two or more components of the signal and the two or more components are transmitted over two or more paths to one or more amplifiers 22 in a multi-amplifier system 18. Polar mode is on possible component mode. One or more of these amplifiers can be operated at saturation for high efficiency. If there are two or more amplifiers one or more can be a higher efficiency class of amplifier (e.g. class B, class C, and with appropriately modified inputs class D, E, F, S, or other switching amplifier configurations). In the composite mode, the composite input signal is transmitted over a composite signal path to the multi-amplifier system 18. The composite input signal can then be amplified by an amplifier 20 (e.g., linear amplifier) operative to amplified signals at or below the threshold level. This allows a smaller (e.g., lower power), less expensive, and more efficient amplifier to be selected for amplification of the composite input signal, such that the amplification system 10 operates with overall improved efficiency and linearity compared to typical amplification systems. It is to be appreciated that the amplifier 20 can be formed from one or more linear amplifiers.

The threshold level of the amplification system 10 can be one or more characteristics associated with the input signal based on a desired efficiency, linearity, distortion and acceptable out-of-band (OOB) emissions of the amplifier system 10. Additionally, the threshold level can be affected by one or more characteristics associated with amplifier system fabrication technology (e.g., Gallium Arsenide (GaAs), Indium Phosphide (InP), Gallium Nitride (GaN), Silicon (Si), Laterally Diffused Metal Oxide Semiconductors (LDMOS)). Many exemplary embodiments of the present invention will be described with respect to the threshold level being a selected envelope amplitude level for illustrative purposes. However, other characteristics (e.g., frequency, phase, or any other readily quantifiable characteristic) associated with the input signal, the multi-amplifier system 18 and/or the fabrication technology can be employed to control the switching of the amplification system 10 between a component mode and a composite mode of operation.

The amplification system 10 includes a digital component 12, such as a programmable logic device, application specific integrated circuit (ASIC), a digital signal processor (DSP) or a combination of digital hardware and/or software components. The digital component 12 includes a mode selector 14 that continuously (e.g., in real-time) switches the amplification system 10 between a component mode and a composite mode based on changes in one or more characteristics of an input signal relative to a threshold level. The mode selector 14 receives an input signal that is typically a phase and amplitude modulated signal. The input signal can be in a variety of different amplitude and/or phase modulated forms. For example, the signal can be a signal that conforms to WCDMA, multi-carrier GSM, OFDM or other signals having high peak-to-average power ratios (PAR).

The input signal can be provided to a component converter (not shown) that transforms the input signal into two or more components, such that the two or more components can be amplified and recombined to form an amplified representation of the composite input signal. Alternatively, the input signal can be provided in component form directly to the mode selector 14. The mode selector 14 also receives one or more threshold levels that can be one or more fixed, selectable or programmable characteristics (e.g., envelope amplitude level) associated with the input signal. Although, the mode selector 14 is illustrated as receiving one or more threshold levels, it is to be appreciated that the one or more threshold levels employed by the mode selector 14 can be preprogrammed or programmable, or based on knowledge associated with changes in characteristics associated with the input signal. Additionally, the one or more threshold levels can be fixed or variable.

A plurality of outputs from the mode selector 14 are provided to a digital-to-analog conversion (DAC) system 16. The plurality of outputs include outputs that provide a set of components, in the component mode, labeled component #1 to component #N, such that recombination of the component #1 through component #N results in the composite signal, where N is an integer greater than or equal to two. The plurality of outputs also include a composite signal output that provides the composite signal to the DAC system 16 in the composite mode. The DAC system 16 converts the components or the composite signal from the digital domain to the analog domain. The analog component signals are provided to one or more amplifiers 22 in the multi-amplifier system 18 for amplification via one or more paths labeled path #1 to path #M, where M is an integer greater than or equal to two. The one or more amplifiers may or may not include the amplifier 20.

The analog composite signal is provided to the amplifier 20 for amplification via a composite signal path in the composite mode. Typically, the composite signal path would be a single path, but multiple path configurations can be employed to amplify the analog composite signal. The amplifier 20 can be selected to be a linear amplifier type (Class-A, Class-AB or Class-B type). The size of the linear amplifier 20 can be selected to handle signals below a predetermined threshold level. Therefore, the linear amplifier 20 can be a substantially smaller amplifier than the one or more amplifiers 22 in the multi-amplifier system 18. Although the linear amplifier 20 is typically a single linear amplifier, a multiple amplifier system, including a polar amplifier, and or a combination of polar amplifier and smaller linear amplifier (that amplifies the smallest signals) can be employed to amplify the composite signal based on desired efficiency, cost and linearity. The amplifier 20 need not be composed of devices of the same material as the other amplifiers.

Figure 2:
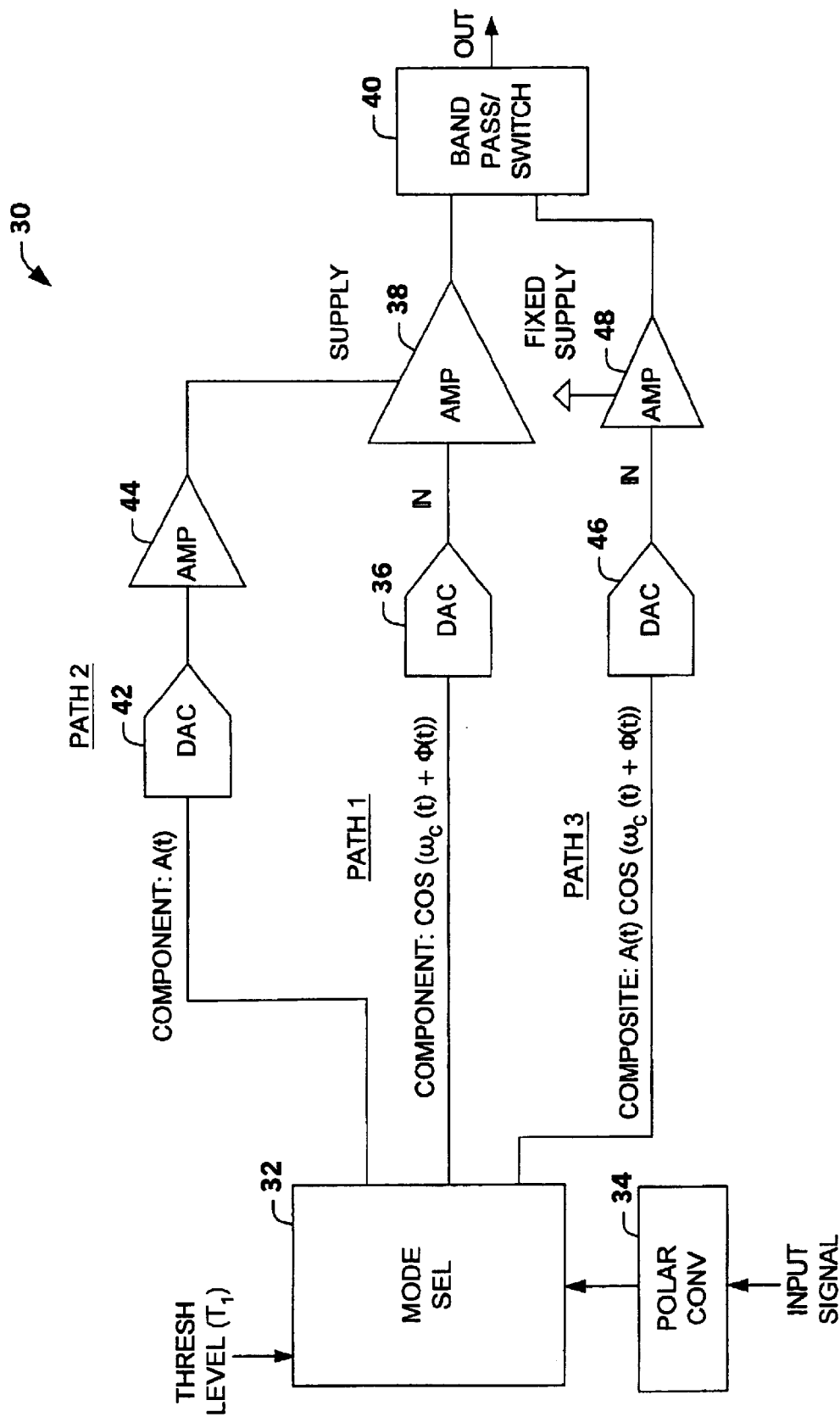
FIG. 2 illustrates an amplifier system that switches operation between a component mode and a composite mode in accordance with an aspect of the present invention.

FIG. 2 illustrates an amplifier system 30 that switches operation between a component mode and a composite mode in accordance with another aspect of the present invention. In the component mode, the polar components of an input signal are amplified and reconstructed in the analog domain. In the composite mode, the composite input signal is amplified in the analog domain. The amplifier system 30 switches between the component mode and the composite mode based on a characteristic of an input signal relative to a threshold level. For example, the threshold level can be a selected envelope amplitude level or digital count corresponding to the envelope amplitude level. The amplifier system 30 can then operate in a component mode for envelope amplitude levels above a threshold level and in a composite mode for envelope amplitude levels below the threshold level.

The amplifier system 30 includes a mode selector 32 that continuously switches the amplifier system 30 between a component mode and a composite mode based on changes in one or more characteristics of an input signal relative to a threshold level. The mode selector 32 receives a composite signal that is a polar representation of an input signal. The input signal is typically a phase and amplitude modulated signal which can be represented in polar form by the following equation:

$$A(t)COS(\omega_c(t)+\phi(t)) \quad\quad\quad EQ.\ 1$$

where $A(t)$ is the amplitude modulated component and $COS(\omega_c(t)+\phi(t))$ is the phase modulated component, $\phi(t)$ is the phase component and $\omega_c(t)$ is the carrier frequency. The input signal can be in a variety of different amplitude and/or phase modulated forms. It is to be appreciated that the above equation illustrates a polar representation of a single carrier input signal, where the actual signal can be a multi-carrier signal. In the multi-carrier case, $\omega_c$ represents a virtual carrier which is a weighted average of the carriers present. For example, the signal can be a signal that conforms to WCDMA, multi-carrier GSM, OFDM or other signals having peak-to-average power ratios (PAR).

The input signal can be provided to a polar converter 34 (optional) that transforms the input signal into a polar composite signal. Alternatively, the input signal can be provided in polar form directly to the mode selector 32. The mode selector 32 or the polar converter 34 can be operative to separate the composite signal into a separate phase modulated component and amplitude modulated component. The mode selector 32 also receives a threshold level $T_1$ that can be one or more fixed, selectable or programmable characteristics (e.g., envelope amplitude level) associated with the input signal.

The amplifier system 30 includes a power amplifier 38 that includes an input terminal (IN) and a supply terminal (SUPPLY). The mode selector 32 has a first output coupled to the input terminal of the power amplifier 38 through a first digital-to-analog converter (DAC) 36 along a first path (PATH 1). The power amplifier 38 can be any type of amplifier including a highly efficient non-linear type (e.g., Class-C, Class-D, Class-E, Class-F) of amplifier since the input to the power amplifier 38 is a phase modulated signal with a substantially constant envelope. It is also to be appreciated that the power amplifier 38 can be other less efficient types of amplifiers based on desirable bandwidth and acceptable distortion limits. However, the employment of a non-linear amplifier provides a more desirable solution for DC-RF efficiency.

The mode selector 32 has a second output coupled to a modulation amplifier 44 through a second DAC 42 along a second path (PATH 2). The output of th modulation amplifier 44 is coupled to the supply terminal (SUPPLY) of the power amplifier 38. The modulation amplifier 44 is typically a DC coupled or audio frequency amplifier. It is to be appreciated that the modulation amplifier 44 can be a pulse width modulator, a switching amplifier, a LINC amplifier (typically two amplifiers and a hybrid coupler), or a linear amplifier based on desirable bandwidth and acceptable distortion limits.

The mode selector 32 has a third output coupled to an amplifier 48 through a third DAC 46 along a third path (PATH 3). The amplifier 48 is typically a linear amplifier type (e.g., Class-A, Class-AB or Class-B type). The size of the amplifier 48 is selected to handle signals below a predetermined threshold level. Therefore, the amplifier 48 can be a substantially smaller amplifier (e.g., lower power) than the power amplifier 38. Although the amplifier 48 is typically a single linear amplifier, a multiple amplifier system, including a polar amplifier, and or a combination of polar amplifier and smaller linear amplifier (that amplifies the smallest signals) can be employed to amplify the composite signal based on desired efficiency, cost and linearity. The amplifier 48 does not have to be composed of devices of the same material as the other amplifiers in the system 30.

In the component mode, the mode selector 32 transmits the phase modulated component $B*COS(\omega_c(t)+\phi(t))$ of the composite signal in digital form to the first DAC 36 along the first path (PATH 1), where B is a constant. The phase modulated component has a substantially constant envelope. The first DAC 36 converts the phase modulated component of the composite signal into the analog domain, which is provided to the input terminal of the power amplifier 38. The mode selector 32 concurrently transmits the amplitude modulated component A(t) of the composite signal in digital form to the second DAC 42 along the second path (PATH 2). The second DAC 42 converts the amplitude modulated component A(t) from the digital domain to the analog domain. The analog amplitude modulated component is then provided to the modulation amplifier 44 which amplitude modulates the supply terminal of the power amplifier 38. The output of the power amplifier 38 is a reconstructed amplified representation of the composite signal.

The amplified composite signal is then provided to an optional band pass filter component 40 which filters out any remaining unwanted signals outside the desired transmission band. The band pass filter component 40 can include a switch that selects the signal provided by the power amplifier 38 or 48 depending on the instantaneous input signal. It is also possible for the mode selector 32 to provide a zero or very low amplitude signal to the input of any or all amplifiers so that a designated signal is output. The band pass filter/switch component 40 can select the signal provided by the power amplifier 38 or the linear amplifier 48 based on a control signal (not shown) state provided by the mode selector 32 that corresponds to present mode (composite mode, component mode). Alternatively, the band pass filter switch component can select the signal provided by the power amplifier 38 or the linear amplifier 48 by sensing a signal being present from one of the power amplifier 38 or the linear amplifier 48.

In the composite mode, the mode selector 32 transmits the composite signal $A(t)COS(\omega_c(t)+\phi(t))$ in digital form to the third DAC 46. The third DAC 46 converts the composite signal into the analog domain, which is provided to the input terminal of the amplifier 48. In one aspect of the present invention, the amplifier 48 has a substantially fixed supply in the composite mode. The composite signal is then provided to the band pass filter/switch 40 that filters out any remaining unwanted signals outside the desired transmission band, and selects the output signal from the linear amplifier 48.

In another aspect of the invention, one or both of the first DAC 42, the second DAC 36 and the third DAC 46 are delta sigma modulated DACs. Delta Sigma modulation is a technique used to generate a coarse estimate of a signal using a small number of quantization levels and a very high sampling rate. The use of a limited number of discrete amplitude levels introduces "quantization" noise into the system. The effect of oversampling and the use of an integrator feedback-loop in delta-sigma modulation are effective in shifting noise to out-of-band frequencies. The noise shifting properties and introduction of quantization error enables efficient use of subsequent filtering stages to remove noise and produce a more precise representation of the input at a much higher frequency. The delta sigma DACs can be employed to digitally upmix the input signal directly to radio transmission frequencies, such that further frequency conversion of the signals via conventional analog mixers is not required. The radio transmission frequencies can be in radio frequency (RF) ranges (e.g., megahertz range) or in microwave frequency ranges (e.g., gigahertz range).

Figure 3:
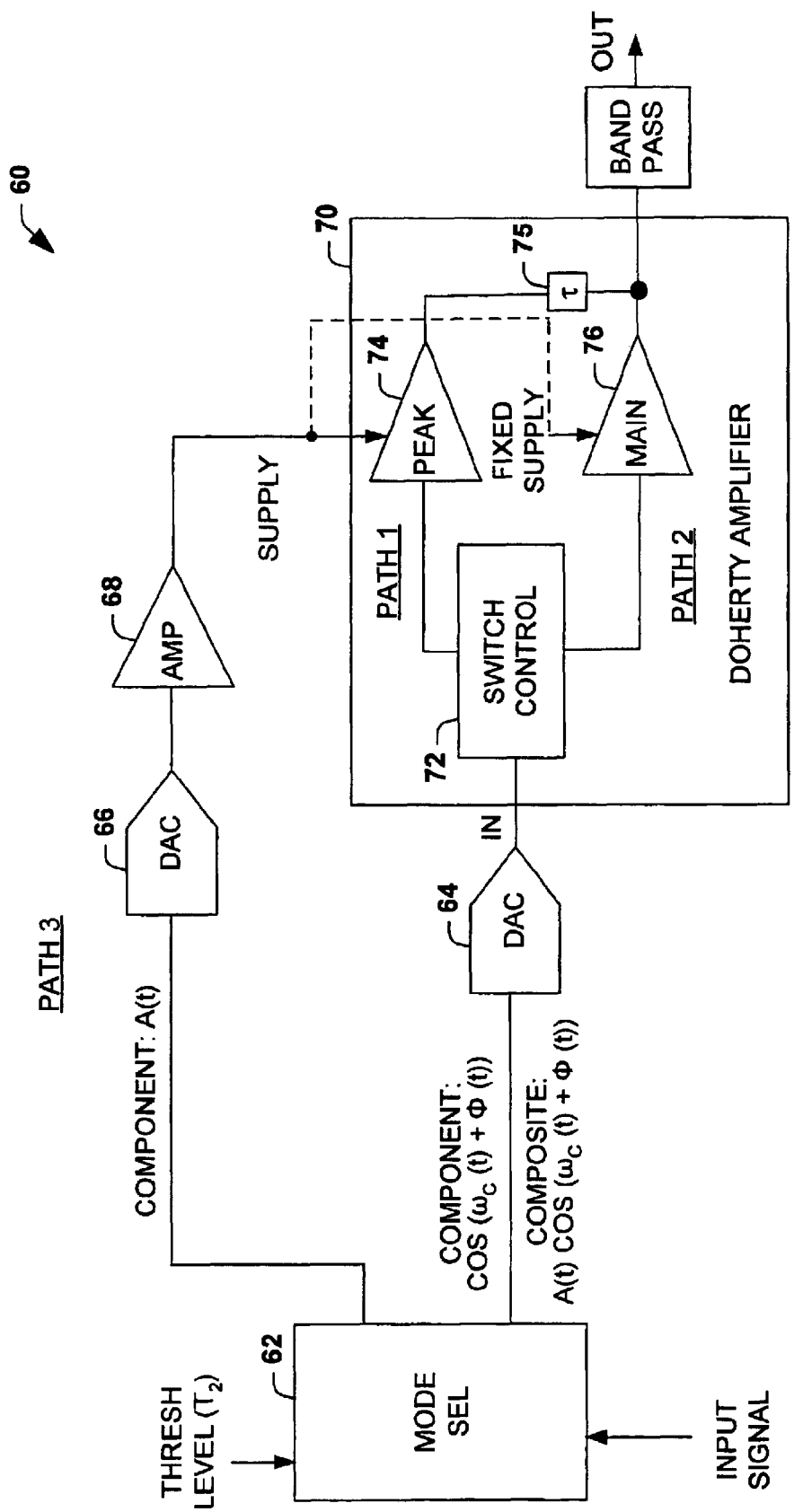
FIG. 3 illustrates another amplifier system that switches operation between a component mode and a composite mode in accordance with an aspect of the present invention.

FIG. 3 illustrates an amplifier system 60 that employs a Doherty amplifier device in accordance with an aspect of the present invention. The amplifier system 60 switches operation between a component mode and a composite mode based on a characteristic of an input signal relative to a threshold level. The amplifier system 60 includes a Doherty amplifier 70 that includes an input terminal (IN) and at least one supply terminal (SUPPLY). The Doherty amplifier 70 includes a peak amplifier 74 along a first path (PATH 1) and a main amplifier 76 along a second path (PATH 2). The output of the peak amplifier is coupled to the output of the main amplifier 76 a lambda/4 waveguide 75. A switch control system 72 is provided that receives an input signal from the input terminal, and provides the input signal to at least one of the peak amplifier 74 and the main amplifier 76 based on an amplitude level of the input signal. The switch control system can include a splitter device, an envelope detector, a drive control device, suitable transmission lines and other devices that turn the peak amplifier 74 between an "ON" and an "OFF" state via control signals and/or modification of the supply to the peak amplifier 74.

In a typical Doherty amplifier configuration, the main amplifier receives the full signal all of the time but is operative to output signals up to a certain saturation amplitude level. The peak amplifier shares the signal load with the main amplifier during peak level signals above the saturation amplitude level. Therefore, the peak amplifier operates only part of the time, while the main amplifier operates all of the time. Although the Doherty amplifier is relatively efficient, it provides poor linearity characteristics. The present invention operates the Doherty amplifier in a component (polar) mode, with the peak amplifier operated at saturation, for input signals above a threshold level and in a composite mode for signals at or below the threshold level. Typically, the peak amplifier in the present invention will be a high efficiency type amplifier and the main amplifier a linear type amplifier. It is not necessary for the peak and main amplifiers to be the same size or maximum power output. It is more efficient if the peak amplifier, which is run at saturation, is much larger than the main amplifier. Therefore, the system 60 operates with both improved efficiency and improved linearity as compared to a Doherty amplifier that operates in a typical configuration.

The system 60 includes a mode selector 62 that receives an input signal and a threshold level ($T_2$). The mode selector 62 has a first output coupled to the input terminal of the Doherty amplifier 70 through a first digital-to-analog converter (DAC) 64. The mode selector 62 has a second output coupled to a modulation amplifier 68 through a second DAC 66 along a third path (PATH 3). The output of the modulation amplifier 68 is coupled to a supply terminal of the Doherty amplifier 70. The supply terminal is coupled to the supply of the peak amplifier 74 and can be coupled to the supply of the main amplifier 76 as indicated by dashed lines. Alternatively, the supply of the main amplifier 76 can be fixed. The modulation amplifier 68 is typically a DC coupled or audio frequency amplifier. It is to be appreciated that the modulation amplifier 68 can be a pulse width modulator, a switching amplifier, a LINC amplifier (typically two amplifiers and a coupler), or a linear amplifier based on desirable bandwidth and acceptable distortion limits.

In the component mode, the mode selector 62 transmits a phase modulated component B*COS ($\omega_c(t)+\phi(t)$) of an input signal in digital form to the first DAC 64, where B is a constant. The phase modulated component has a substantially constant envelope amplitude. The first DAC 64 converts the phase modulated component of the composite signal into the analog domain, which is provided to the input terminal of the Doherty amplifier 70. The mode selector 62 concurrently transmits an amplitude modulated component A(t) of the composite signal in digital form to the second DAC 66. The second DAC 66 converts the amplitude modulated component A(t) from the digital domain to the analog domain. The analog amplitude modulated component is then provided to the modulation amplifier 68 which amplitude modulates the supply terminal of the Doherty amplifier 70 or the supply terminal of the peak amplifier 74. The main amplifier 76 can be supplied by the amplitude modulated component or supplied at a fixed supply level. The output of the Doherty amplifier 70 is a reconstructed amplified representation of the composite signal, with contributions from both the main 76 and peak amplifier 74. The amplified composite signal is then provided to an optional band pass filter 78, which filters out any remaining unwanted signals outside the desired transmission band.

In the composite mode, the mode selector 62 transmits the composite signal A(t)COS($\omega_c(t)+\phi(t)$) in digital form to the DAC 64. The DAC 84 converts the composite signal into the analog domain, which is provided to the input terminal of the Doherty amplifier 70. The mode selector 62 concurrently transmits a signal of substantially fixed amplitude in digital form to the DAC 66, which sets a substantially fixed supply to one or both the peak amplifier 74 and the main amplifier 76 through the modulation amplifier 68. The peak amplifier 74 and the main amplifier 76 have supply levels, such that the peak amplifier 74 is "OFF", such that the main amplifier 76 receives the entire composite signal. The amplified composite signal is then provided to the optional band pass filter 78 which filters out any remaining unwanted signals outside the desired transmission band.

In one aspect of the invention, one or both of the first DAC 64 and the second DAC 66 are delta sigma modulated DACs. The delta sigma DACs can be employed to digitally-upmix the input signal directly to radio transmission frequencies, such that further frequency conversion of the signals via conventional analog mixers is not required.

Figure 4:
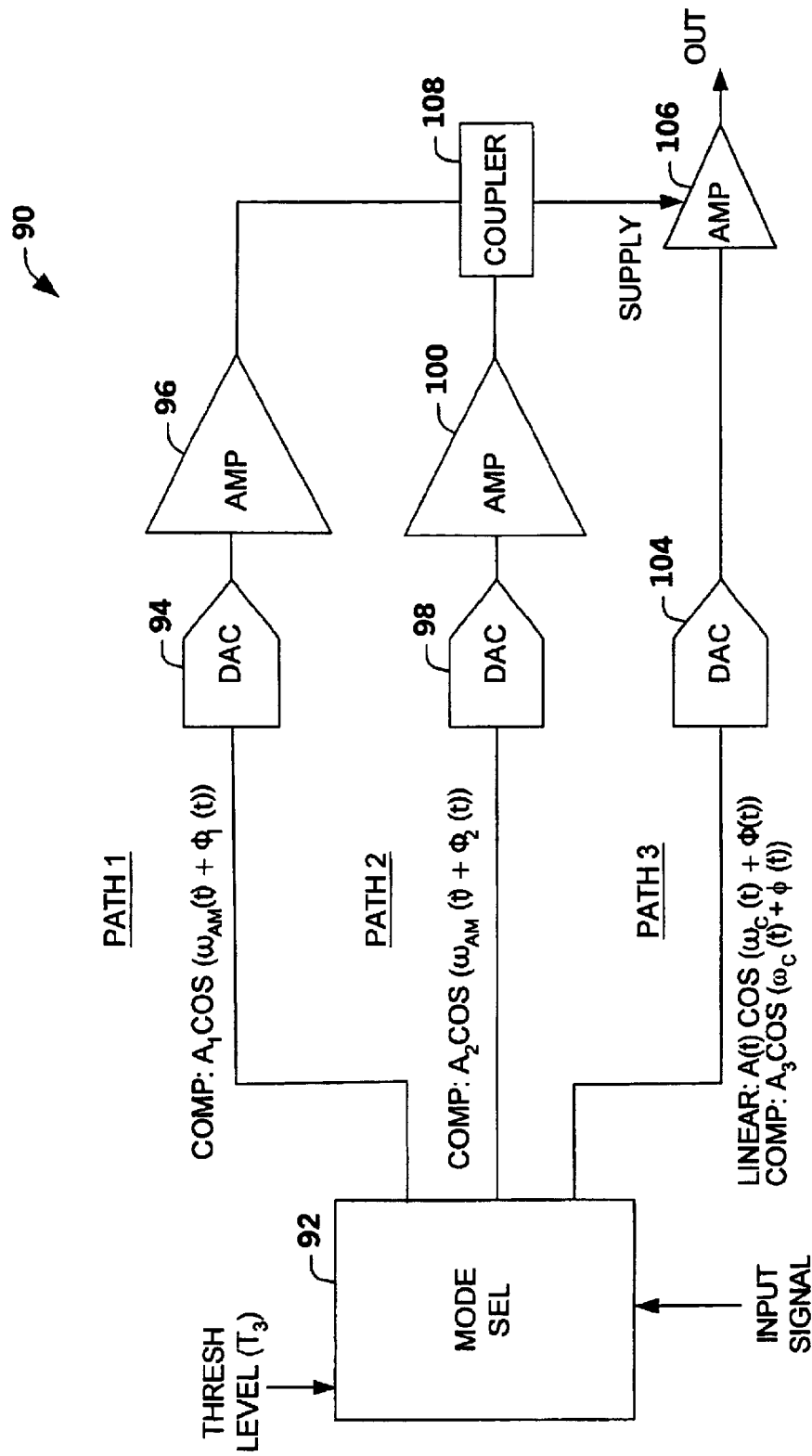
FIG. 4 illustrates yet another amplifier system that switches operation between a component mode and a composite mode in accordance with an aspect of the present invention.

FIG. 4 illustrates an amplifier system 90 in accordance with yet another aspect of the present invention. The amplifier system 90 switches operation between a component mode and a composite mode based on a characteristic of an input signal relative to a threshold level. The amplifier system 90 includes a mode selector 92 that receives an input signal and a threshold level $T_3$, and selects between providing a first and a second phase modulated component and a composite signal based on evaluating the input signal with respect to the threshold level $T_3$. The threshold level can be one or more fixed, selectable or programmable characteristics (e.g., envelope amplitude level) associated with the input signal.

The mode selector 92 has a first output coupled to the input terminal of a first amplifier 96 through a first digital-to-analog converter (DAC) 94 along a first path (PATH 1). The mode selector 92 has a second output coupled to a second amplifier 100 through a second DAC 98 along a second path (PATH 2). The first and second amplifiers 96 and 100 receive the first and second phase modulated components, respectively in the component mode. The first and second amplifiers 96 and 100 can be any type of amplifier. However, the first and second amplifiers 96 and 100 can be a highly efficient non-linear type (e.g., Class-C, Class-D, Class-E, Class-F) of amplifier since the input to the first and second amplifiers 96 and 100 are phase modulated signals with substantially constant envelope amplitudes. It is also to be appreciated that the first and second amplifiers 96 and 100 can be other less efficient types of amplifiers based on desirable bandwidth and acceptable distortion limits. However, the employment of a non-linear amplifier provides a more desirable solution for DC-RF efficiency.

The mode selector 92 has a third output coupled to a third amplifier 106 through a third DAC 104 along a third path (PATH 3). The third amplifier 106 receives the composite input signal in the composite mode and a signal proportional to the phase modulated component in component mode. The amplifier 106 can be a linear amplifier, a Doherty amplifier, or can represent a multiple amplifier system.

In the component mode, the input signal is separated into a first phase modulated component, a second phase modulated component and a third phase modulated component. The first phase modulated component and the second phase modulated component represent the amplitude modulated portion of the composite signal and the third phase modulated component represents the phase modulated component of the composite signal such that:

$$A(t)\text{COS}(\omega_c(t)+\phi(t))=(A_1\text{COS}(\omega_{AM}(t)+\phi_1(t)+A_2\text{COS}(\omega_{AM}(t)+\phi_2(t)))$$
$$*A_3\text{COS}(\omega_c(t)+\phi(t)) \quad \text{EQ. 2}$$

where $A_1$, $A_2$ and $A_3$ are respective signal amplitudes, $\phi_1(t)$ and $\phi_2(t)$ are modulations whose sum represent the envelope or AM information in the signal and $\omega_{AM}(t)$ is a frequency within the bandwidth of the AM component. The mode selector 92 provides the first phase modulated component $A_1\text{COS}(\omega_{AM}(t)+\phi_1(t))$ in digital form to the first DAC 94 along the first path (PATH 1). The first DAC 94 converts the first phase modulated component of the composite signal into the analog domain, which is provided to the input terminal of the first amplifier 96. The mode selector 92 concurrently transmits the second phase modulated component $A_2\text{COS}(\omega_{AM}(t)+\phi_2(t))$ of the composite: signal in digital form to the second DAC 98 along the second path (PATH 2). The second DAC 98 converts the second phase modulated component from the digital domain to the analog domain.

The analog signals of the first phase modulated component and the second phase modulated components are combined at the outputs of the first and the second amplifiers 96 and 100 via a coupler 108. The combined output of the first and the second amplifiers 96 and 100 modulates the supply terminal of the power amplifier 106. The third phase modulated component is provided to the input of the third amplifier 106 via the DAC 104. The output of the third amplifier 106 is a reconstructed amplified version of the composite signal, such that the amplifier system 90 operates as a polar-type amplifier in the component mode. Amplifiers 96 and 100 may be non-linear amplifiers to provide high efficiency AM modulation, after being combined. This use of non-linear amplifiers to produce linear amplification is much more straightforward than at RF. In this application the AM frequencies are far lower than the wanted signal carrier frequency and the supply voltage is relatively insensitive of OOB emissions.

In the composite mode, the mode selector 92 transmits the composite signal $A(t)\text{COS}(\omega_c(t)+\phi(t))$ in digital form to the third DAC 104 and a substantially constant waveform is supplied to PATH1 and/or PATH 2. The third DAC 104 converts the composite signal into the analog domain, which is provided to the input terminal of the third amplifier 106. In one aspect of the invention, one or both of the first DAC 94, the second DAC 98 and the third DAC 104 are delta sigma modulated DACs.

Figure 5:
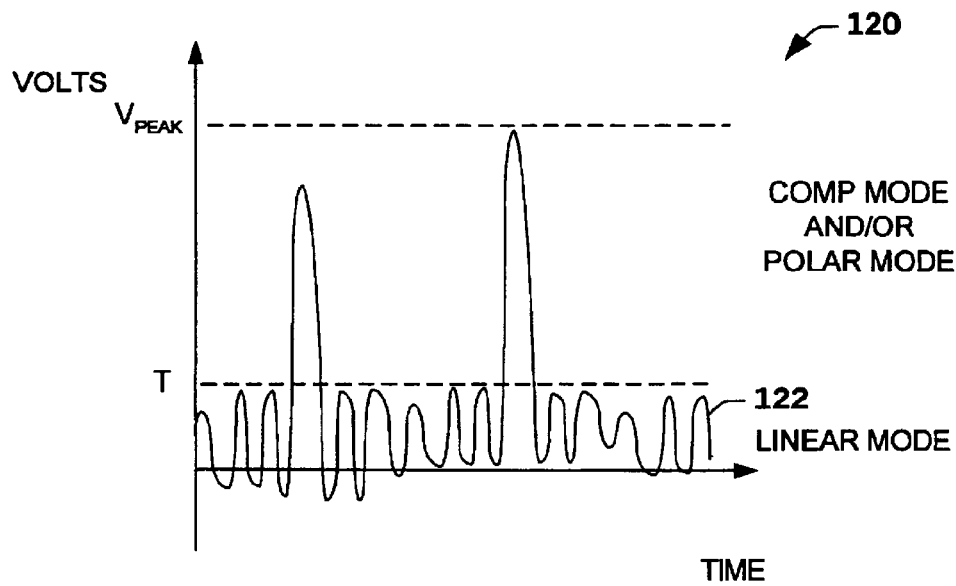
FIG. 5 illustrates a graph of voltage versus time of an exemplary input signal provided to an amplifier system as illustrated in FIGS. 2–3.

It is to be appreciated that the threshold level can be selected to achieve a desired efficiency, linearity and amplifier system cost. FIG. 5 illustrates a graph 120 of voltage versus time of an exemplary composite input signal 122 provided to an amplifier system as illustrated in FIGS. 2–3. The threshold level is selected to be an envelope amplitude voltage threshold level T. The threshold level is selected such that the envelope amplitude voltage level of the signal 122 is at or below the threshold level T substantially longer than the signal is above the threshold level, such that the amplifier system operates in a composite mode (e.g., linear mode) substantially longer than the component mode (e.g., polar mode). For signals having substantially high peak to average ratios, the signal is provided to the linear amplifier substantially longer than the remaining amplifiers in the amplifier system. Therefore, th linear amplifier can be selected to operate more efficiently than typical amplifier systems employing signals with high peak-to-average ratios.

The amplifier system of the present invention minimizes the complexity of the circuitry necessary to amplify a given input signal by performing many of the functions that create variables in the amplifier system in the digital domain. This also facilitates component modulation synchronization in the component mode since many of the delays associated with convention component signal amplifiers are mitigated. Additionally, the operation of the amplifier system can be further improved by employing linearization techniques in the digital domain.

Figure 6:
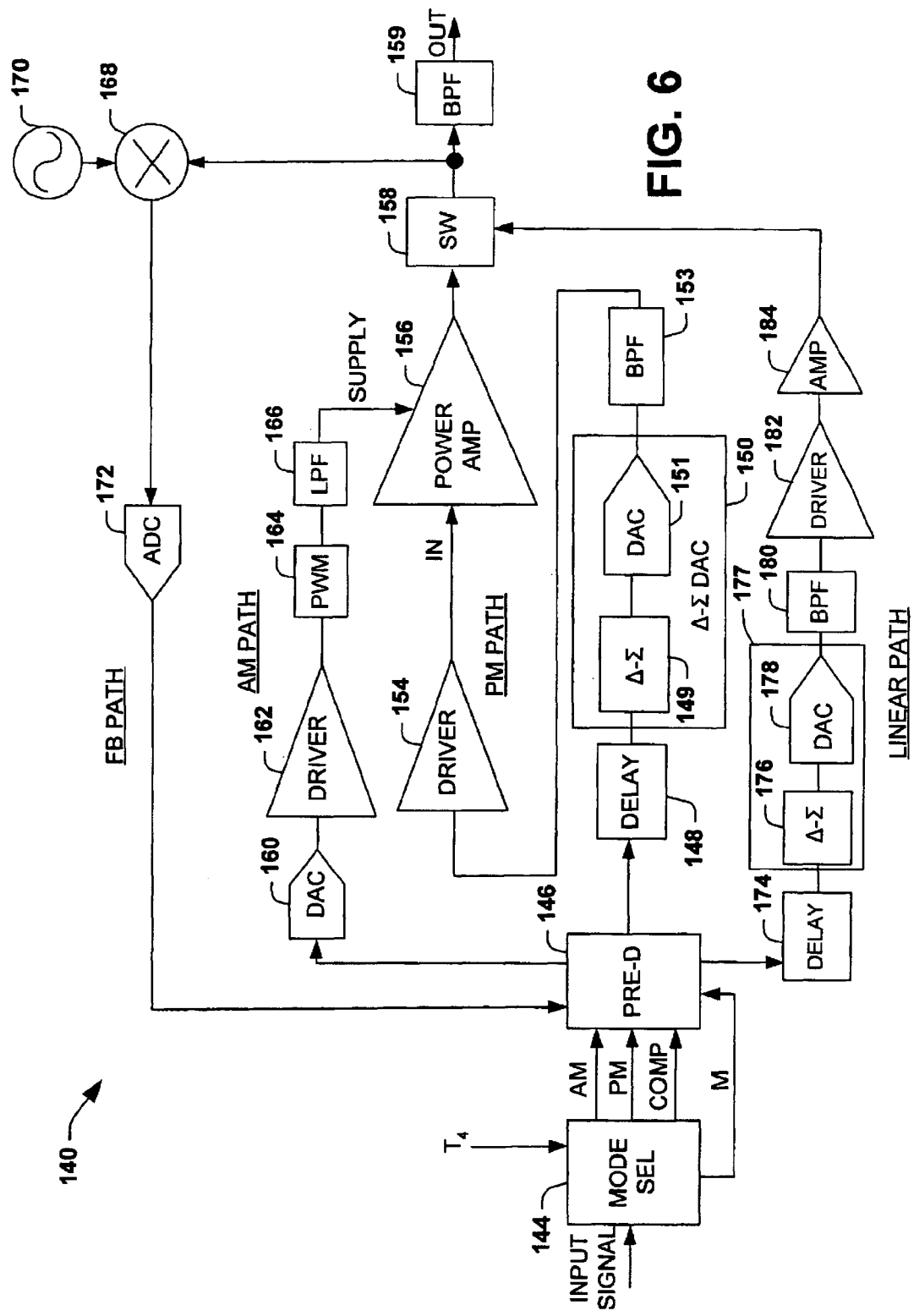
FIG. 6 illustrates a schematic block diagram of an amplifier system employing pre-distortion linearization techniques in accordance with an aspect of the present invention.

FIG. 6 illustrates an amplifier system 140 employing pre-distortion linearization techniques in accordance with an aspect of the present invention. Pre-distortion modifies the signals to reduce anticipated distortion in the amplifier chain as well as in the composite output signal. Determination of the desired pre-distortion is typically performed off-line. The pre-distortion techniques of the present invention are employed in the digital domain, such that the digital input signal is modified prior to digital-to-analog conversion. Pre-distortion can be performed on the composite signal prior to separating the composite signal into amplitude and phase modulated components. Alternatively, pre-distortion can be performed on the composite signal, and the signal components separately according to the selected operating mode (e.g., component mode, composite mode).

The amplifier system 140 includes a mode selector 144 that receives an input signal, for example, having amplitude and phase modulation. The mode selector 144 determines the operating mode (e.g., composite or linear mode, component or polar mode) of the amplifier system 140 based on a characteristic of the input signal, such as envelope amplitude, with respect to a threshold level $T_4$. In the component mode, the mode selector 144 transmits an amplitude modulated (AM) component and a phase modulated (PM) component of the input signal to a predistortion component 146. In the composite mode, the mode selector 144 transmits an input signal (COMP) to the predistortion component 146. The mode selector 144 also provides the predistortion component 146 with mode information through a mode line (M).

The predistortion component 146 employs the mode information to determine the desired predistortion to add to or remove from the composite input signal in the composite mode, or the PM and the AM components in the component mode. Different predistortion is added or removed from the composite signal, the PM component and the AM component. It is to be appreciated that the predistortion component 146 and the mode selector 144 can be one or more digital hardware components and/or software algorithms.

The predistortion component 146 has a first output coupled to a digital-to-analog converter (DAC) 160 that converts the AM component to an analog signal along an AM path. An optional driver 162 is provided to buffer and add gain to the analog AM component, which is then provided to a pulse width modulator 164)or other high efficiency amplifier). The pulse width modulator 164 cooperates with a low pass filter 166 to provide a Class-S type or Class-G type of amplifier/modulator. The pulses of the pulse width modulator 164 are integrated via the low pass filter 166 to provide an output that is a function of the width of the pulses from the pulse width modulator 164. The output of the low pass filter 166 is coupled to the supply terminal of a power amplifier 156 within a PM path.

The predistortion component 146 has a second output coupled to a delta-sigma DAC 150 through a delay component 148 along the PM path. The delay component 148, facilitates synchronization of the PM component and the AM component during component mode operation. The delta sigma DAC 150 includes a delta sigma modulator 149 coupled to a DAC 151. The DAC 151 can be a multi-bit DAC or a single-bit DAC. The output of the delta sigma DAC 150 is coupled to a band pass filter 153. The delta-sigma modulator 149 performs a digital-to-digital conversion or quantization of the input signal to provide a signal of lower resolution at a higher frequency. The DAC 151 then converts the quantized signal from the digital domain to the analog domain. The band pass filter 153 filters out noise associated with the quantization of the input signal.

The delta sigma DAC 150 can be employed to digitally upmix or convert the signal to radio transmission frequencies, so that the need for analog mixers is not required. The output of the band pass filter 153 is then provided to a driver 154, which provides some additional gain to the input signal. The output of the driver 154 is then provided to the input terminal of the power amplifier 156 for amplification. The output of the amplifier is provided to a band pass filter/switch component 158, which filters out any remaining unwanted signals outside the desired transmission band, and selects the signal provided by the power amplifier 156 in component mode.

The power amplifier 156 can be a non-linear type amplifier (e.g., Class-C, Class-D, Class-E, Class-F) since the input signal to the power amplifier 156 is a phase modulated signal with a substantially constant envelope and its supply is modulated so it operates at saturation. However, the power amplifier 156 can be a linear amplifier (e.g., Class-A, Class-AB, Class-B) based on desired performance, acceptable efficiency and acceptable OOB emissions.

The predistortion component 146 has a third output coupled to a delta-sigma DAC 177 through a delay component 174 along a linear path. The delta sigma DAC 177 includes a delta sigma modulator 176 coupled to a DAC 178. The DAC 178 can be a multi-bit DAC or a single-bit DAC. The output of the delta sigma DAC is coupled to a band pass filter 180. The delta-sigma modulator 176 performs a digital-to-digital conversion or quantization of the input signal to provide a signal of lower resolution at a higher frequency. The DAC 178 then converts the quantized signal from the digital domain to the analog domain. The band pass filter 180 filters out noise associated with the quantization of the input signal. The output of the band pass filter 180 is then provided to a driver 182, which provides some additional gain to the input signal. The output of the optional driver 182 is then provided to the input terminal of a linear amplifier 184 for amplification. The output of the linear amplifier 184 is then provided to a switch 158. The switch 158 is provided to select between outputs of the linear amplifier 184 and the power amplifier 156. The output of the switch 158 is coupled to a band pass filter 159 that couples or adds the outputs ultimately controlling the output by making one input zero or close to zero. The feedback to 168 can be either before or after the BPF 159. The BPF 159 reduces emission outside the transmission band.

The amplifier system 140 includes an optional feedback (FB) path from the output signal to the predistortion component 146 to compensate for variations in the system. The optional feedback path includes a mixer 168 and a local oscillator 170. The output signal is downconverted and digitized using a high dynamic range, highly linear ADC 172. The digitized values are compared to the expected signal parameters. Differences in measured and expected values are used to adapt the values used by the pre-distortion component 146. The adaptation is substantially slower than the signal and is primarily to account for temperature and aging changes in the system 140.

It is to be appreciated that optional taps (not shown) can be provided at the gate and drain inputs of the power amplifier 156 to calibrate and synchronize their relative delay. Additionally, an optional feedback path (not shown) from the output of the amplifier 156 can be provided for the AM path. In the optional feedback path, the output of the power amplifier 156 would be passed through an analog envelope detector and sent to a small error amplifier after the DAC 160 in the AM Path to remove errors in the AM signal. An optional filter (not shown) can be provided on the output of the AM Path DAC 160 which may be required depending on the type of DAC (e.g., delta sigma DAC) utilized.

In the component mode, the predistortion component 146 transmits the predistorted PM component of the composite signal through the PM path and the predistorted AM component of the composite signal through the AM path. The PM component and the AM component are provided by the predistortion component 146 in digital form and converted to analog form to the input terminal and supply terminal, respectively, of the power amplifier 158. The output of the power amplifier 156 is provided to the switch 158. In the composite mode, the predistortion component 146 transmits the predistorted composite signal through the linear path. The composite signal provided by the predistortion component 146 is in digital form and converted to analog form to the input terminal of the linear amplifier 184. The output of the linear amplifier 184 is provided to the switch 158.

Figure 7:
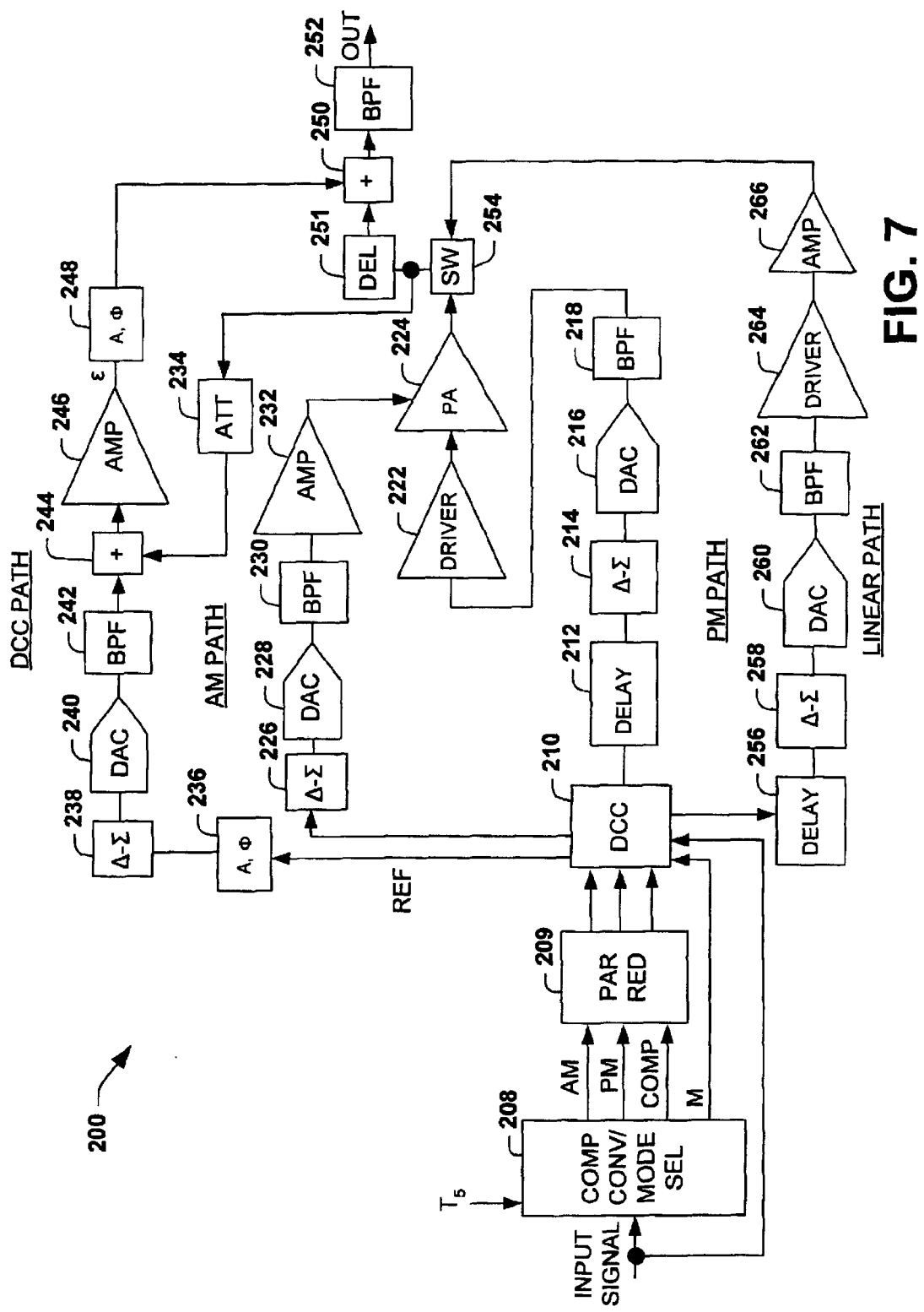
FIG. 7 illustrates a schematic block diagram of an amplifier system employing an alternate linearization technique in accordance with an aspect of the present invention.

FIG. 7 illustrates an amplifier system 200 employing an alternate linearization technique in accordance with an aspect of the present invention. The alternate technique is referred to as digital cross-cancellation and can be implemented alone or combined with the predistortion technique illustrated in FIG. 6. The digital cross-cancellation technique provides a digital reference of the wanted signal to a separate DAC generating a "clean" version of the wanted signal. The clean version of the wanted signal is inverted and combined with a portion of the output signal from the power amplifier to determine the unwanted portion of the output signal. The unwanted portion of the input signal is distortion and undesirable out-of band (OOB) emissions. The unwanted portion of the input signal is then inverted and combined with the output signal to cancel the unwanted portion from the output signal. Typically, an amplifier system that separates a signal into components does not have a single reference signal. However, the present invention provides for generation of a clean reference signal or an inverted version of a clean reference signal in the digital domain.

A component converter/mode selector 208 receives an input signal, for example, having amplitude and phase modulation. The component converter/mode selector 208 determines the operating mode (e.g., composite or linear mode, component or polar mode) of the amplifier system 200 based on a characteristic of the input signal, such as envelope amplitude, with respect to a threshold level $T_5$. In the component mode, the component converter/mode selector 208 transmits an amplitude modulated (AM) component and a phase modulated (PM) component of the input signal to a PAR reduction component 209. In the composite mode, the component converter/mode selector 208 transmits an input signal (COMP) to the PAR reduction component 209. The PAR reduction component 209 can reduce peak signal levels through clipping or inclusion of the addition of signals. It can also apply pre-distortion to the composite signal and/or amplitude and phase terms to counter expected distortion. The PAR reduction component 209 then passes the selected signals to a digital cross-cancellation (DCC) component 210. The DCC component 210 can add or remove signals to the first and second digital outputs to improve the performance of the amplifier system 200. The DCC component 210 also receives the original input signal prior to PAR reduction, and a mode signal (M) containing mode information.

The DCC component 210 generates a first digital output signal during component mode operation. The first digital output signal is transmitted to a delta-sigma modulator 214 through a delay component 212. The delay component 212 facilitates synchronization of the PM component and the AM component during component mode operation, in addition to facilitating cross-cancellation of the final output signal. The delta sigma modulator 214 is coupled to a DAC 216 and a band pass filter 218. The delta-sigma modulator 214, the DAC 216 and the band pass filter 218 cooperate to perform a digital-to-analog conversion directly to radio transmission frequencies. The output of the band pass filter 218 is then provided to a driver 222, which provides some additional gain to the analog input signal. The output of the driver 222 is then provided to the input terminal of the power amplifier 224 for amplification. The power amplifier 224 can be a linear amplifier (e.g., Class-A, Class-AB, Class-B) or non-linear type amplifier (e.g., Class-C, Class-D, Class-E, Class-F) based on desired performance, acceptable efficiency and acceptable OOB emissions. The output of the power amplifier 224 is then provided to a switch component 254, which selects the signal provided by the power amplifier 224 during component mode operation.

A second digital output signal is also transmitted during component mode operation. The second digital output signal is transmitted to a delta-sigma modulator 226. The delta sigma modulator 226 is coupled to a DAC 228 and a band pass filter 230. The delta-sigma modulator 226, the DAC 228 and the band pass filter 230 cooperate to perform a digital-to-analog conversion directly to radio transmission frequencies. The output of the band pass filter 230 is then provided to a modulation amplifier 232 (e.g., Class-S, Class-G). The output of the modulation amplifier 232 is coupled to the supply terminal of the power amplifier 224 to provide the desired amplitude modulation in the component mode.

The DCC component 210 generates a third digital output during composite mode operation. The third digital output is coupled to a delta-sigma modulator 258 through a delay component 256 along a linear path. The delta sigma modulator 256 is coupled to a DAC 260 and a band pass filter 262. The delta-sigma modulator 258, the DAC 260 and the band pass filter 262 cooperate to perform a digital-to-analog conversion directly to radio transmission frequencies. The output of the band pass filter 266 is then provided to a driver 264, which provides some additional gain to th input signal. The output of the driver 264 is then provided to the input terminal of a linear amplifier 266 for amplification. The output of the linear amplifier 166 is then provided to the switch component 254, which selects the signal provided by the linear amplifier 266 during composite mode operation.

The DCC component 210 provides a fourth digital signal along a DCC path to a digital inverter 236. The fourth digital signal is a reference version (REF) of the input signal corresponding to the desired amplified output signal prior to any modifications. Alternatively, the digital inverter 236 can be eliminated and the inverted version of the clean reference signal can be provided by the DCC component 210. The inverted clean reference signal is transmitted to a delta-sigma modulator 238. The delta sigma modulator 238 is coupled to a DAC 240 and a band pass filter 242. The delta-sigma modulator 238, the DAC 240 and the band pass filter 242 cooperate to perform a digital-to-analog conversion directly to radio transmission frequencies of the inverted version of the clean reference signal (REF).

A small portion of the output of the switch 254 is split off by a coupler through an attenuator 234 and summed with the inverted clean reference signal through a summer-244. The output of the summer 244 is signal distortion and OOB emissions. The output of the summer 244 is amplified by an error amplifier 246 to produce an error signal (e). The error signal is inverted through an inverter 248 to provide an inverted error signal. The inverted error signal is recombined with a delayed version (via delay device 251) of the output of the switch 254 through a summer 250 to remove OOB emissions and reduce distortion levels. The output of the summer 250 is then provided to a band pass filter 252 which filters out any remaining unwanted signals outside the desired transmission band.

The digital cross-cancellation technique in accordance with an aspect of the present invention can supply correction for amplifier distortions and it can correct spectral leakage into adjacent channels that occurs from intentional clipping of the wanted signals performed to allow for amplifier size reduction (e.g., amplifiers in the AM and PM paths are sized to according to the peak signals). Additionally, since a digital clean reference signal is employed to determine the desired correction at the output, any modification of the signal can be corrected at the final output stage without the need for additional correction information during the amplification process.

It is to be appreciated that although the linearization techniques described in FIGS. 6–7 are applied to amplifier systems similar to the one described in FIG. 2, the above linearization techniques can be applied to other amplifier systems including the one described in FIG. 3.

Figure 8:
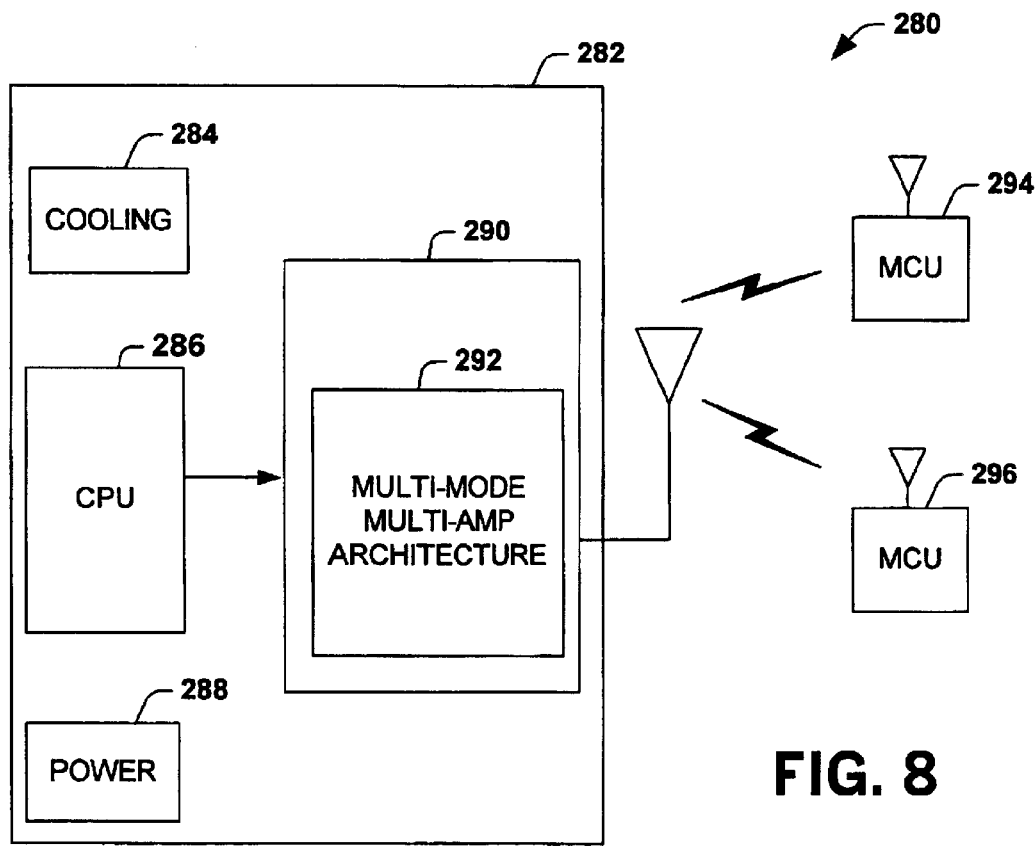
FIG. 8 illustrates a block diagram of a communication system in accordance with an aspect of the present invention.

The amplifier system of the present invention can be employed in a number of applications. The amplifier system can be employed in wireless transmitter applications for base stations (e.g., satellites, cellular), handsets, and other mobile communication devices. FIG. 8 illustrates a communication system 280 having a base station 282 with a transmitter 290 employing a mufti-mode multi amplifier architecture system 292 (dual component-composite mode operation) in accordance with an aspect of the present invention. The multi-mode multi amplifier architecture system 292 operates in a composite mode when envelope signals are at or below a threshold level and in a component mode when envelope signals are above a threshold level.

A central processing unit (CPU) 286 is coupled to the multi-mode multi amplifier architecture system 292. The CPU 286 can facilitate control and threshold selection of the multi-mode mufti amplifier architecture system 292. For example, the CPU 286 can generate the type of signal (e.g., WCDMA, GSM, OFDM) to be transmitted and select the threshold level in which the multi-mode multi amplifier architecture system 292 switches between component mode and composite mode. The base station 282 communicates to a group of mobile communication unit (MCUs) comprised of MCUs 294 and 296. The MCUs 294 and 296 are for illustrative purposes and it should be appreciated that the group of MCUs can include a greater number of MCUs based on the number of carriers in the output signal.

The base station 282 also includes cooling devices 284 and power devices 288. The power devices 288 can include AC-DC power converters, fuses, battery backup devices that protect the base station 282 from power loss failures. The power devices 288 and cooling devices 284 can be substantially reduced in size and cost compared to conventional devices since the multi-mode multi amplifier architecture system 292 of the present invention operates with substantially more efficiency than conventional amplifier systems. Although the base station 282 is illustrated as having a single transmitter 290, the base station 282 can have a plurality of transmitters communicating to different respective groups of MCUs over similar communication signal standards or different communication signal standards. Additionally, the MCUs 294 and 296 can also include transmitters with multi-mode multi amplifier architecture system 292 that operate in a composite mode and component mode similar to that described for the transmitter 290.

Figure 9:
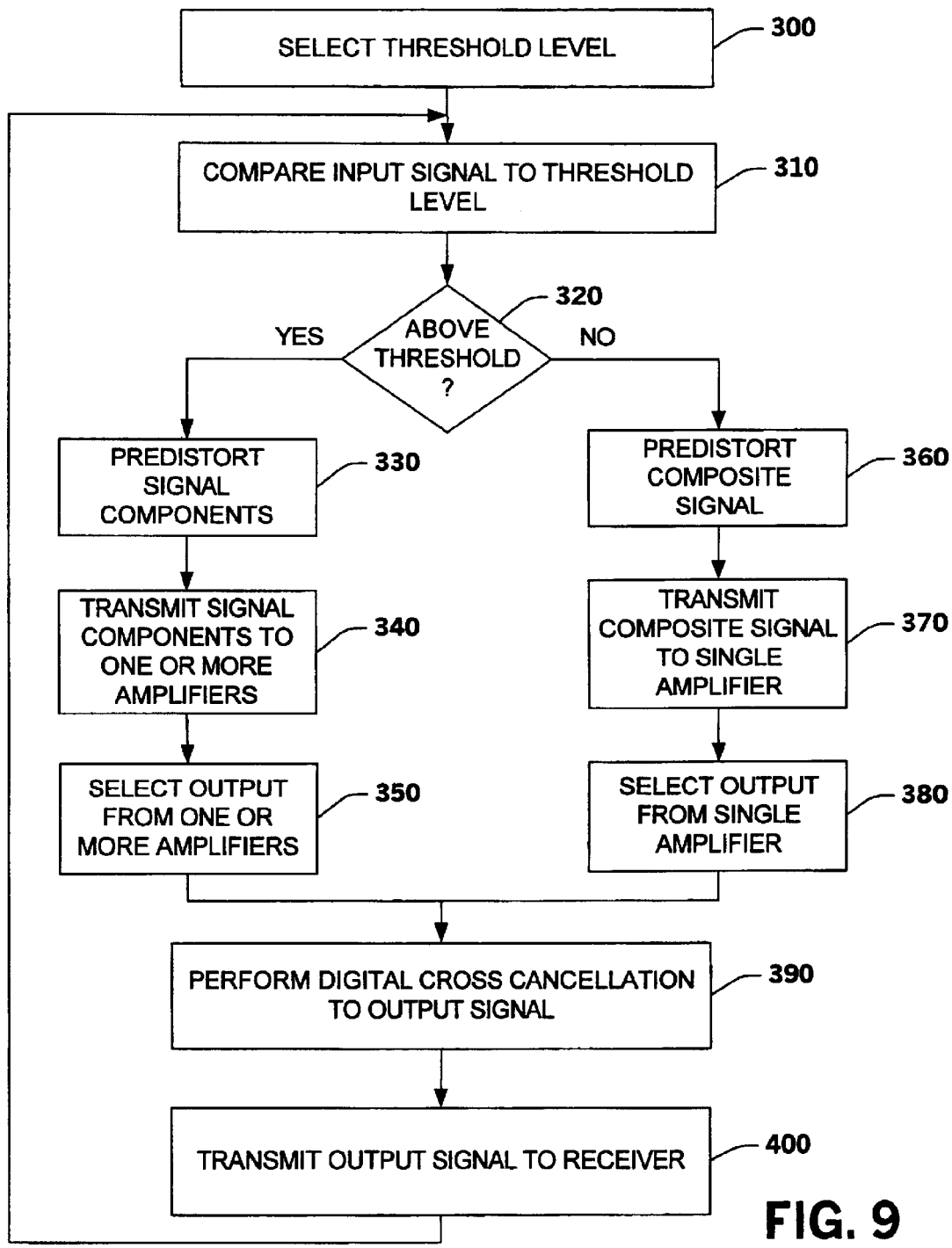
FIG. 9 illustrates a methodology for operating an amplifier system in one of a component mode and a composite mode in accordance with an aspect of the present invention.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 9 illustrates a methodology for operating an amplifier system in one of a component mode and a composite mode in accordance with an aspect of the present invention. The methodology begins at 300 where a threshold level is selected. The threshold level can be, for example, an envelope amplitude level in which the amplifier system operates in a component mode at envelope amplitude levels that are above the threshold level, and in a composite mode at envelope amplitude levels at or below the threshold level. At 310, the input signal is compared to the threshold level. This comparison can be done by monitoring a signal or employing an algorithm that switches mode operation by knowledge associated with the amplitude levels of the input signal. The input signal can be in a number of different single carrier or multi-carrier amplitude and phase modulated signal formats (e.g., WCDMA, GSM, OFDM).

At 320, the amplifier system determines if the input signal is above the threshold level. The threshold level can be a signal amplitude level and the component mode selected for envelope amplitudes of the input signal level being above, at or below a selected envelope amplitude threshold level. It is to be appreciated that other signal characteristics can be employed to determine at which portion of the input signal that the amplifier system operates in a component mode and at which portion of the input signal that the amplifier system operates in a composite mode.

If the input signal is above the threshold level (YES), the methodology proceeds to 330. At 330, predistortion is applied to the components of the input signal. Predistortion adds or removes portions of the input signal to remove anticipated unwanted distortion. For example, if the input signal is separated into polar components, the predistortion is combined with the amplitude modulated component and the substantially constant envelope phase modulated component separately. The methodology then proceeds to 340. At 340, the signal components are transmitted to one or more amplifiers for amplification. The output from the one or more amplifiers is selected, for example, via a switch, at 350. The methodology then proceeds to 390.

If the input signal is not above the threshold level (NO) at 320, the methodology proceeds to 360. At 360, predistortion is applied to the composite input signal. Predistortion adds or removes portions of the input signal to remove anticipated unwanted distortion. The predistortion is applied to the composite input signal separately from the signal components. The methodology then proceeds to 370. At 370, the composite input signal is transmitted to a single amplifier for amplification. The output from the single amplifier is selected, for example, via a switch, at 380. The methodology then proceeds to 390.

At 390, digital cross-cancellation is performed on the output of the selected amplifier. The digital cross-cancellation technique provides a digital reference to a separate DAC generating a "clean", undistorted version of the wanted signal. Th clean version of the wanted signal is inverted and combined with an attenuated version of the actual output signal from the selected amplifier to determine the unwanted portion of the output signal. The unwanted portion of the input signal is then inverted and combined with a delayed version of the output of the power amplifier to cancel the unwanted portion from the output signal. At 400, the predistorted, digitally cross-cancelled selected output signal is transmitted to one or more destination receivers. The methodology then returns to 310 to continue comparing the input signal to the threshold level.

What has been described above includes exemplary implementations of the present invention. It is, of course, not possible to describe very conceivable combination of components or methodologies for purposes of describing the present invention but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplification system comprising:
   a mode selector that controls operation of the amplification system between a component mode and a composite mode based on a characteristic of an input signal relative to a threshold level; and
   an amplifier system having a plurality of amplifiers that cooperate to amplify components of the input signal in the component mode to provide a reconstructed amplified representation of the input signal and a single amplifier that amplifies the input signal in the composite mode to provide an amplified representation of the input signal.

2. The system of claim 1, the amplifier system comprising a linear amplifier that receives the input signal in the composite mode along a composite signal path, and at least one additional amplifier that receives components of the input signal in the component mode along at least one different path from the composite signal path.

3. The system of claim 2, the linear amplifier also receives at least a portion of the components of the input signal along the composite signal path in the component mode.

4. The system of claim 1, further comprising a digital-to-analog conversion system that converts digital representations of the components of the input signal and digital representations of the input signal received from the mode selector to analog representations of the components of the input signal and the input signal which are provided to the amplifier system.

5. The system of claim 1, the components of the input signal comprising a phase modulated component of the input signal and an amplitude modulated component of the input signal.

6. The system of claim 5, the amplitude modulated component of the input signal being provided to a supply terminal of a power amplifier and the phase modulated component being provided to an input terminal of the power amplifier during the component mode.

7. The system of claim 5, the amplitude modulated component of the input signal being provided to one or more of the supply terminals of a Doherty amplifier and the phase modulated component being provided to an input terminal of the Doherty amplifier during the component mode.

8. The system of claim 7, the Doherty amplifier comprising a peak amplifier and a main amplifier, the amplitude modulated component modulating the peak amplifier and the main amplifier having a substantially fixed supply in the component mode, both the peak amplifier and the main amplifier having substantially fixed supplies in the composite mode, such that the input signal is provided to the main amplifier along a composite signal path in the composite mode.

9. The system of claim 7, the Doherty amplifier comprising a peak amplifier and a main amplifier, the amplitude modulated component modulating both the peak amplifier and the main amplifier during the component mode.

10. The system of claim 5, the amplitude modulated component being separate into at least two components that are amplified via respective amplifiers and recombined to modulate the supply terminal of the power amplifier.

11. The system of claim 1, further comprising a predistortion component that modifies one of the input signal and components of the input signal to mitigate output distortion of the multiple amplifier system.

12. The system of claim 1, further comprising a digital cross-cancellation component that generates a reference signal corresponding to a desired output signal of the multiple amplifier system, the clean reference signal being combined with a portion of an output signal from the multiple amplifier system to determine an error signal, the error signal being inverted and combined with a delayed version of the output signal of the multiple amplifier system to generate a final output signal.

13. The system of claim 1, further comprising at least one of a predistortion component that modifies at least one of the input signal and components of the input signal to mitigate output distortion of the multiple amplifier system, and a digital cross-cancellation component that generates a reference signal corresponding to a desired output signal of the multiple amplifier system, the clean reference signal being combined with a portion of an output signal from the multiple amplifier system to determine an error signal, the error signal being inverted and combined with a delayed version of the output signal of the multiple amplifier system to generate a final output signal.

14. The system of claim 13, further comprising a peak-to-average reduction (PAR) component that removes peaks portions of the input signal, the digital cross-cancellation component adding the peaks portions back to the final output signal.

15. The system of claim 1, further comprising a feedback path to compensate for variations in age and temperature of the amplifier system.

16. A transmitter comprising the amplifier system of claim 1.

17. An amplification system comprising:
a multiple amplifier system having a first amplifier, a second amplifier and a third amplifier; and
a mode selector that switches between a composite mode and a component mode based on characteristic of the input signal relative to a threshold level, the mode selector provides a first component of an input signal along a first path to the first amplifier and a second component of an input signal along a second path the second amplifier in th component mode, and provides an input signal along a third path to the third amplifier in the composite mode.

18. The system of claim 17, the first component being an amplitude modulated component of the input signal that is provided to a supply terminal of the second amplifier via the first amplifier, and the second component being a phase modulated component provided to the input terminal of the second amplifier, such that the first and second amplifier perform a polar operation in the component mode to provide a reconstructed amplified representation of the input signal.

19. The system of claim 18, the first amplifier being one of a PWM, linear, or non-linear type modulator, the second amplifier being a linear or non-linear class type power amplifier and the third amplifier being a linear class type amplifier.

20. The system of claim 17, the second amplifier and third amplifier form a Doherty type amplifier, such that the second amplifier is a peak amplifier and the third amplifier is a main amplifier.

21. The system of claim 17, the first and second component being a first phase modulated component and a second phase modulated component that are combined to modulated the supply of the third amplifier.

22. An amplification system comprising:
means for separating an input signal into components;
means for switching operation of the amplifier system between a component mode and a composite mode based on a characteristic of the input signal relative to a threshold level;
means for providing a reconstructed amplified representation of the input signal from the components in the component mode; and
means for amplifying the input signal in the composite mode.

23. The system of claim 22, the means for separating an input signal into components comprising converting th input signal into an amplitude modulated component and a phase modulated component.

24. The system of claim 22, further comprising means for converting at least a portion of the input signal from the digital domain to the analog domain directly to a desired radio transmission frequency.

25. A method of operating an amplification system, the method comprising:
switching the mode of the amplifier system between component mode operation and composite mode operation based on a characteristic of an input signal relative to a threshold level;
providing components of the input signal to at least one amplifier during component mode operation to provide an amplified reconstructed representation of the input signal;
providing the input signal to a linear amplifier during composite mode operation to provide an amplifier representation of the input signal; and
selecting one of the amplified representation of the input signal and the reconstructed amplified representation of the input signal based on a present mode operation.

26. The method of claim 25, further comprising transmitting the selected representation of the amplified input signal to at least one receiver.

27. The method of claim 25, the providing components of the input signal to at least one amplifier during component mode operation comprising providing an amplitude modulated component to a supply of a power amplifier and a phase modulated component to an input of the power amplifier.

* * * * *